United States Patent
Tan et al.

(10) Patent No.: US 7,342,297 B1
(45) Date of Patent: Mar. 11, 2008

(54) SAWN POWER PACKAGE

(75) Inventors: Eng Hwa Tan, Melaka (MY); Santhiran S/O Nadarajah, Melaka (MY); Peng Soon Lim, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 132 days.

(21) Appl. No.: 10/831,537

(22) Filed: Apr. 22, 2004

(51) Int. Cl.
*H01L 23/495* (2006.01)
(52) U.S. Cl. ...................... 257/666; 257/670
(58) Field of Classification Search ............ 257/666, 257/670
See application file for complete search history.

(56) References Cited

U.S. PATENT DOCUMENTS

| | | | |
|---|---|---|---|
| 3,574,815 A | 4/1971 | Segerson | |
| 4,451,973 A | 6/1984 | Tateno et al. | |
| 6,307,755 B1 * | 10/2001 | Williams et al. | ............ 361/813 |
| 6,399,415 B1 | 6/2002 | Bayan et al. | |
| 6,888,228 B1 * | 5/2005 | Mostafazadeh et al. | ..... 257/666 |

* cited by examiner

*Primary Examiner*—Kiesha L. Rose
(74) *Attorney, Agent, or Firm*—Beyer Weaver LLP

(57) ABSTRACT

In one embodiment of the invention, a lead-frame is designed for use in IC packages such as those conforming to the TO 220 standard or other standards for power packages. The device areas of the lead-frame are arranged in columns, and each column is molded so as to expose a portion of the leads. The device areas can then be singulated by sawing, as in conventional QFN packages. In this manner, packages conforming to power package standards such as the TO 220 standard can be produced much quicker and cheaper than they can in conventional trim and forming methods.

15 Claims, 4 Drawing Sheets

SAWN POWER PACKAGE

BRIEF DESCRIPTION OF THE INVENTION

This invention relates to the packaging of integrated circuits (ICs). More specifically, this invention relates to methods and apparatuses for fabricating sawed inline packages.

BACKGROUND OF THE INVENTION

The singulation of IC power packages, or those ICs designed to transport and/or regulate electrical power, has traditionally been accomplished via known trim and forming methods. In these methods, a custom-tooled die is used to punch encapsulated packages out from their lead-frames, where their leads are formed to a desired configuration, again employing custom tooling. It is known that these methods suffer from certain drawbacks. More specifically, such custom tooling is expensive, and is good only for one package configuration. Each time a different package configuration is to be singulated, new custom tooling is required, even further adding to expenses.

In contrast, the singulation of non-power IC packages can often be performed much more cheaply and flexibly. Specifically, packages such as quad flat no-lead (QFN) packages can often be sawn via known sawing methods in which rotating saw blades are employed to cut up and singulate encapsulated lead-frames into individual IC packages. Because multiple saw blades can be run simultaneously (a configuration referred to as gang-cutting), singulation of QFN packages and the like can often be done quicker and cheaper than the singulation of IC power packages. Additionally, because individual saw blades can be placed at any distance apart on a gang-cutter by using simple spacers instead of expensive custom tooling, the same gang-cutter can be employed to singulate many different package configurations without the need for expensive retooling.

Accordingly, it would be desirable to develop methods and apparatuses for singulating IC power packages by sawing, rather than by conventional trimming and forming. As can be seen from the QFN context, the ability to singulate IC power packages by sawing allows for cheaper and more flexible fabrication.

SUMMARY OF THE INVENTION

Broadly speaking, the invention pertains to a lead-frame designed for use in IC power packages, which is also compatible with QFN-type sawing techniques. The lead-frame is designed with columns of device areas, where encapsulant material is applied to mold each column, with the leads partially exposed. The lead-frame is then sawed in typical QFN-type fashion, with a gang-cutter making perpendicular cuts that are spaced so as to singulate each power package.

The invention can be implemented in numerous ways, including as a method, system, device, or apparatus. Several embodiments of the invention are discussed below.

As a method of packaging an integrated circuit die, one embodiment of the invention contemplates the use of a lead-frame having an array of device areas, each device area having a die attach pad and a plurality of leads. Each device area is configured for use in an inline semiconductor die package. A semiconductor die is attached to each of the device areas, and electrically connected to its associated leads. The device areas are encapsulated with an encapsulant material, and the device areas are sawn apart from each other so as to generate a plurality of singulated inline packages.

In some embodiments, the lead-frame has at least one two-dimensional array of device areas arranged in rows and columns. Within each device area, the leads are arranged to extend to one side of their associated die attach pad. Encapsulant material is applied to each of the columns so as to expose at least a portion of the leads associated with each column. The device areas are sawn apart from each other so as to generate a plurality of singulated inline packages.

As a molded lead-frame for use in semiconductor packaging, one embodiment of the invention comprises a two-dimensional array of device areas arranged in rows and columns. Each device area is configured for use in an inline semiconductor die package and has leads that are arranged to extend to one side of their associated die attach pad. Each die attach pad supports a semiconductor die that is electrically connected to its associated leads. An encapsulant is molded over the lead frame to define columns of encapsulant material that cover associated column of devices while leaving portions of the leads exposed.

Other aspects and advantages of the invention will become apparent from the following detailed description taken in conjunction with the accompanying drawings which illustrate, by way of example, the principles of the invention.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

In one embodiment of the invention, a lead-frame is designed for use in IC power packages, such as those conforming to the TO 220 standard or other standards for power packages. This lead-frame is also compatible with known singulation procedures that involve sawing, such as those employed in the fabrication of QFN packages. In short, the lead-frame is designed as an array of device areas for use in inline packages, where the leads are located to one side of the device area and the die attach pad is located toward the other. The device areas are arranged in columns, and each column is partially encapsulated so as to expose a portion of the leads. The device areas are then singulated by sawing, as in conventional QFN packages. In this manner, packages conforming to power package standards such as the TO 220 standard can be produced much quicker and cheaper than they can in conventional trim and forming methods.

Figure 1:
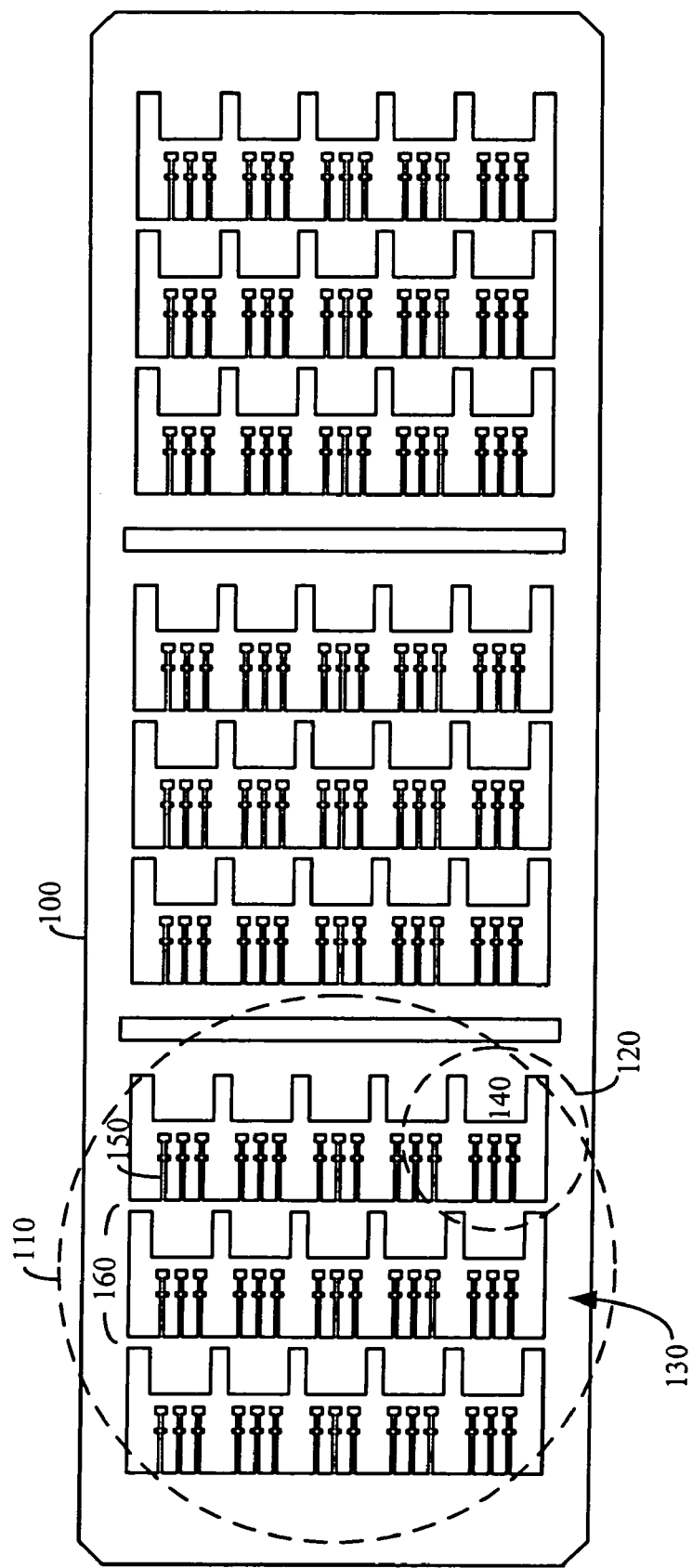
FIG. 1 illustrates a lead-frame having panels of device areas constructed in accordance with an embodiment of the invention.

FIG. 1 illustrates an example of such a lead-frame. Here, a lead-frame 100 has a number of two dimensional arrays 110, each having a number of device areas 120 arranged in columns 130. Each device area 120, in turn, has a die attach pad 140 for supporting a semiconductor die, and a plurality of leads 150 that are to be electrically connected to the die. In the leftmost and rightmost columns 130 of each array 110, leads 150 or die attach pads 140 are directly attached to the lead-frame 100. In intermediate columns 130, leads 150 and die attach pads 140 are attached to support rails 160 instead.

One of skill will observe that the lead-frame 100, with its leads 150 and die attach pad 140 extending from opposite sides of each device area 120, is configured for use in inline power packages such as TO 220-type packages (i.e., those packages that conform to the TO 220 standard) and the like. However, the lead-frame 100 also has device areas 120 arranged in a generally flat two-dimensional array, suitable for singulation by the same sawing equipment used in singulating surface mount packages such as QFN packages.

Figure 2A:
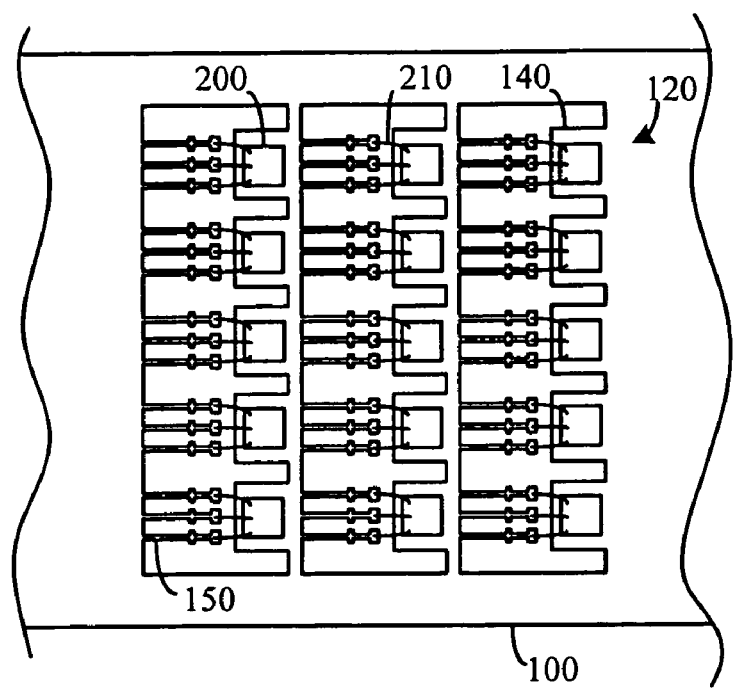
FIGS. 2A-B illustrate die attach, wire bonding, and encapsulation processes associated with the packaging of ICs in accordance with an embodiment of the invention.
Figure 2B:
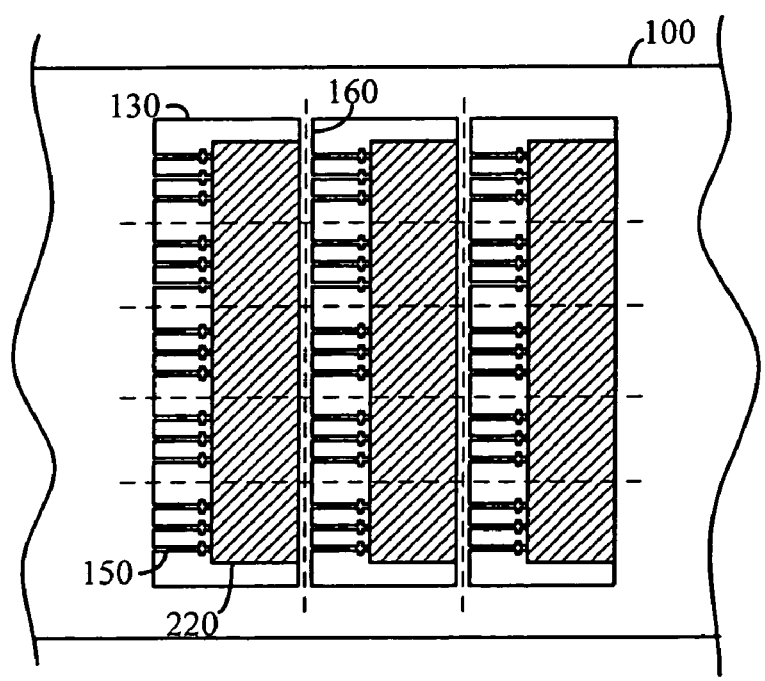

In operation then, power packages can be formed by subjecting the lead-frame 100 to conventional surface mount package fabrication processes, rather than by more expensive and less flexible trim and forming methods. FIGS. 2A-B illustrate the application of such fabrication processes using the lead-frame 100. Semiconductor dice 200 are attached to each die attach pad 140 and electrically connected to respective leads 150 by bond wires 210. Once the dice 200 are wirebonded, columns 130 are encapsulated with an encapsulant material 220, and known gang-cutting saws cut the lead-frame 100 along the dotted lines to singulate each package.

The use of gang-cutting saws allows for the singulation of an entire array 110 at one time, in contrast to current trim methods that punch out only single packages, or single rows of packages, at once. This singulating of multiple devices at once is aided by the fact that the support rails 160 are sufficiently thin that they can be cut through with a single pass of a saw blade, allowing two perpendicular passes of a gang-cutter to singulate an entire array 110. The use of such a lead-frame 100, with thin support rails 160, thus facilitates fast, flexible and relatively inexpensive QFN-type singulation processes to be employed in the context of power packages.

Similarly, because the spacing between current gang-cutting saws can be easily adjusted, they can saw device areas 120 of any size. The invention thus contemplates the sawing of an array of arbitrarily-sized device areas 120, so as to simultaneously singulate entire arrays of IC power packages of any type.

After singulation, packages can be subjected to various other processes as necessary. For example, the leads 150 can be formed by conventional methods in order to conform to various package standards.

Note that the encapsulant material 220 is applied in columns (again, by known column molding processes), leaving portions of the leads 150 exposed. In this manner, through hole packages and other packages that conform to IC power package standards can be fabricated by sawing, instead of by trimming and forming. The column-molded lead-frame of FIG. 2B thus represents packages that conform to power package standards like the TO 220, yet can be fabricated and sawed in similar fashion to surface mount packages.

Figure 3A:
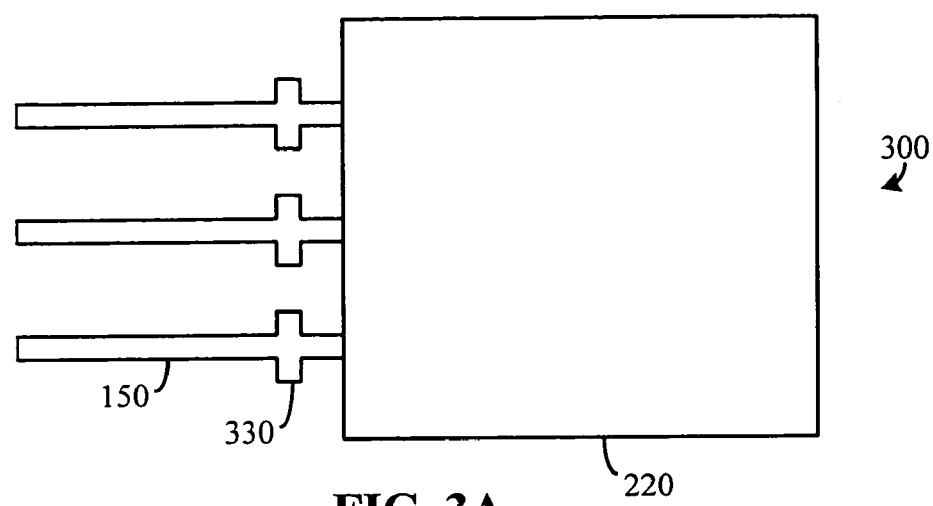
FIGS. 3A-C illustrate top, cutaway side, and bottom views of an IC power package that has been constructed and singulated in accordance with an embodiment of the invention.
Figure 3B:
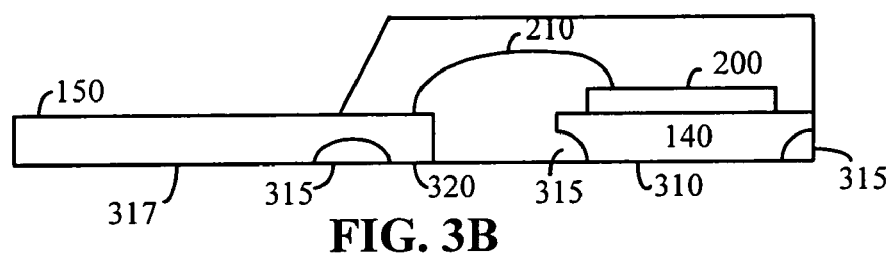
Figure 3C:
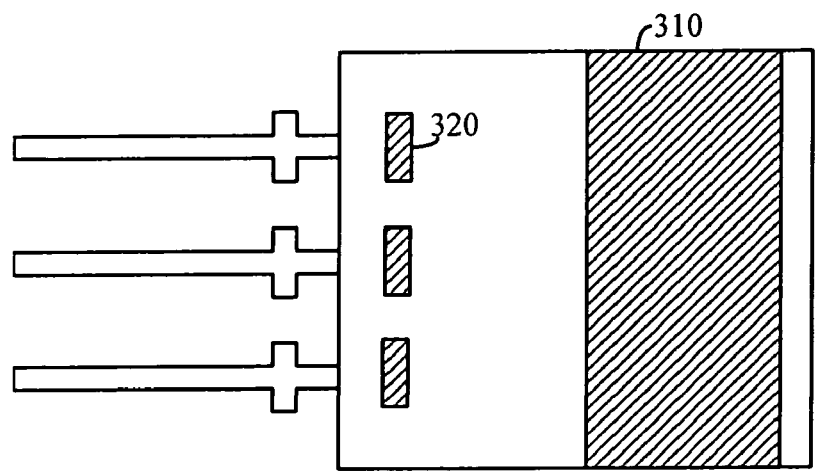

FIGS. 3A-C illustrate top, cutaway side, and bottom views, respectively, of an IC power package that has been constructed and singulated in accordance with an embodiment of the invention. Once the lead-frame 100 is column-molded as in FIG. 2B, it is sawed to produce individual IC packages 300 as shown. Each package 300 is an IC power package conforming to an IC power package such as the TO 220 standard, and suitable for through hole mounting to a printed circuit board (PCB). Specifically, encapsulant material 220 surrounds the die 200, die attach pad 140, and a portion of the leads 150, while a remaining portion of the leads 150 remains exposed from the encapsulant material 220 for surface mounting. Thus, while the package 300 is fabricated according in a novel way for an IC power package, it is still capable of being used in the same manner as any other known power package.

Because the package 300 is fabricated using a lead-frame 100 that is compatible with QFN-type manufacturing processes, it can also offer a number of features to enhance its utility. For example, cutout areas 315 can be etched from the leads 150 and/or die attach pad 140 to provide a locking mechanism that enhances the adhesion between the encapsulant material 220 and leads 150/die attach pad 140. That is, the cutout areas 315 allow encapsulant material 220 to flow into and more thoroughly surround areas previously taken up by the leads 150 and/or die attach pad 140, so as to more securely "lock" them to the encapsulant material 220.

Figure 4:
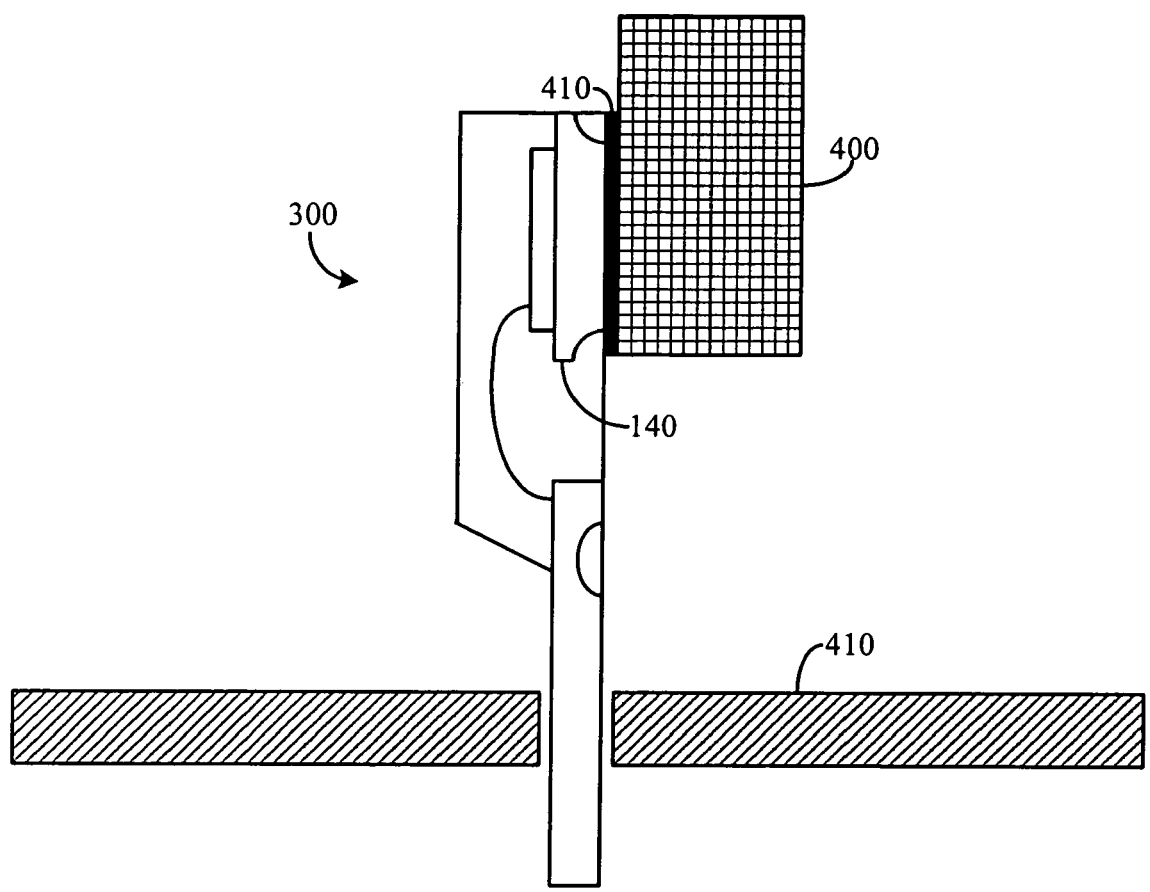
FIG. 4 illustrates through hole power package with an attached heat sink, constructed in accordance with an embodiment of the invention.

Additionally, the lower surface 310 of the die attach pad 140 (i.e., the surface opposite to that which is attached to the die 200) is often coplanar with the lower surface 317 of the leads 150, facilitating the exposure of the lower surface 310 from the encapsulant material 220. This exposed lower surface 310 allows the die 200 to be more effectively cooled, especially when it is exposed to a coolant or affixed to a thermal conductor such as a heat sink. FIG. 4 illustrates an example of the latter, in which a heat sink 400 (commonly having cooling fins for increasing the surface area exposed for convective cooling) is affixed to the lower surface 310 via a known thermally conductive adhesive 410. When the package 300 is surface-mounted to a PCB 410 and in use, the heat sink 400 allows for superior heat dissipation as compared to packages 300 without heat sinks 400 or exposed lower surfaces 310.

If particular saw configurations have difficulty in cutting through portions of the lead-frame 100 such as the support rails 160 or die attach pads 140, thin tie bars can instead be employed. Such tie bars are simply thin connectors attaching components of the device areas 120, such as the die attach pads 140, to portions of the lead-frame 100 such as the support rails 160. For instance, instead of attaching an entire edge of the die attach pad 140 to a support rail 160 as in FIG. 1, the die attach pads 140 can be attached to their respective support rails 160 by thin bars. The configuration and fabrication of such tie bars is known, and typically involves either stamping them out at the same time the details of the device areas 120 are stamped, or etching them after first stamping the remainder of the lead-frame 100. It should be noted that the use of tie bars to avoid cutting through thick support rails 160 often means using multiple saw passes, typically one pass on each side of a support rail 160, rather than a single saw pass in each direction. This is often required to singulate components on both sides of the support rail 160 rather than simply cutting through the rail 160 in a single pass. As such, while saw blade life can be increased, the use of tie bars can also result in longer manufacturing times and lower throughput relative to some other embodiments of the invention.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings. For example, lead-frames embodying principles of the invention can be configured for use in packages conforming to any standard, TO 220 or otherwise. Additionally, while the packages 300 shown are configured for through hole mounting, the principles of the invention can be readily applied to surface mounted power packages by simply configuring the lead-frame and leads appropriately. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A molded lead-frame for use in semiconductor packaging, comprising:
    a two-dimensional array of immediately adjacent device areas arranged in a plurality of rows and a plurality of columns, each device area configured for use in an inline semiconductor die package and having a first side, a second side substantially opposite the first side, leads, and a die attach pad, wherein all of the leads of each particular device area extend from the first side of the particular device area, and wherein the die attach pad of each particular device area extends from the second side of the particular device area;
    a plurality of semiconductor dice, each die being affixed to an associated die attach pad and electrically connected to associated leads; and
    a plurality of columns of encapsulant material, each column of encapsulant material being arranged to over at least the dice in an associated column of device areas while leaving at least a portion of the leads associated with each device area exposed.

2. A molded lead-frame for use in semiconductor packaging, comprising:
    a two-dimensional array of immediately adjacent device areas arranged in a plurality of rows and a plurality of columns, each device area configured for use in an inline semiconductor die package and having a first side, a second side substantially opposite the first side, leads, and a die attach pad, wherein all of the leads of each particular device area extend towards the first side of the particular device area, and wherein the die attach pad of each particular device area extends towards the second side of the particular device area;
    a plurality of substantially parallel support rails that extend substantially parallel to the columns of device areas between a pair of associated adjacent columns of device areas, wherein each device area has two adjacent support rails with a first of the adjacent support rails extending along the first side of the device area and carrying all of the leads associated with the device area and the second of the adjacent support rails extending along the second side of the device area and carrying the die attach pad associated with the device area, wherein all of the leads and the die attach pads in each intermediate column of device areas are carried only by a pair of associated support rails;
    a plurality of semiconductor dice, each die being affixed to an associated die attach pad and electrically connected to associated leads; and
    a plurality of distinct columns of encapsulant material, each column of encapsulant material being arranged to cover at least portions of all of the dice in only a single associated column of device areas while leaving at least a portion of the leads associated with each device area exposed.

3. The molded lead-frame of claim 2 wherein each device area is configured for use in a TO 220-type package.

4. The molded lead-frame of claim 2 wherein each of the device areas has a thickness of approximately 0.010-0.012 inches.

5. The molded lead-frame of claim 2 wherein two of the support rails in the two dimensional array are edge support rails that carry components for only a single adjacent column and at least one additional support rail is a middle support rail that carries components for two adjacent columns, whereby all of the leads and die attach pads associated with the device areas in the two dimensional array are carried by the support rails.

6. The molded lead-frame of claim 2 wherein each of the die attach pads and each of the leads are coupled to adjacent support rails by one or more tie bars.

7. The molded lead-frame of claim 2 wherein each die attach pad has a first surface configured to receive an associated semiconductor die, and a second surface opposite to the first surface, and wherein the second surface is exposed from the encapsulant material.

8. The molded lead-frame of claim 7 wherein each first surface has an area greater than the area of the associated second surface that is exposed from the encapsulant material.

9. The molded lead-frame of claim 2 wherein each of the leads has a first surface configured for electrical connection to an associated semiconductor die, and a second surface opposite to the first surface, and wherein the encapsulant material covers at least a portion of the second surface so as to facilitate adhesion of the leads to the encapsulant material.

10. A lead-frame panel for use in semiconductor packaging, comprising:
    a two-dimensional array of immediately adjacent device areas arranged in a plurality of rows and a plurality of columns, each device area configured for use in an inline semiconductor die package and having a first side, a second side substantially opposite the first side, leads, and a die attach pad, wherein all of the leads of each particular device area extend towards the first side of the particular device area, and wherein the die attach pad of each particular device area extends towards the second side of the particular device area; and
    a plurality of substantially parallel support rails that extend substantially parallel to the columns of device areas between a pair of associated adjacent columns of device areas, wherein each device area has two adjacent support rails with a first of the adjacent support rails extending along the first side of the device area and carrying all of the leads associated with the device area and the second of the adjacent support rails extending along the second side of the device area and carrying the die attach pad associated with the device area, wherein all of the leads and the die attach pads in each intermediate column of device areas are carried only by a pair of associated support rails.

11. The lead-frame panel of claim 10 wherein each device area is configured for use in a TO 220-type package.

12. The lead-frame panel of claim 10 wherein each of the device areas has a thickness of approximately 0.010-0.012 inches.

13. The lead-frame panel of claim 10 wherein two of the support rails in the two dimensional array are edge support rails that carry components for only a single adjacent column and at least one additional support rail is a middle support rail that carries components for two adjacent columns, whereby all of the leads and die attach pads associated with the device areas in the two dimensional array are carried by the support rails.

14. The lead-frame panel of claim 10 wherein each of the die attach pads and each of the leads are coupled to adjacent support rails by one or more tie bars.

15. A lead-frame panel for use in semiconductor packaging, comprising:

a two-dimensional array of immediately adjacent device areas arranged in a plurality of rows and a plurality of columns, each device area configured for use in an inline semiconductor die package and having a first side, a second side substantially opposite the first side, leads, and a die attach pad, wherein all of the leads of each particular device area extend towards the first side of the particular device area, and wherein the die attach pad of each particular device area extends towards the second side of the particular device area; and a plurality of substantially parallel support rails that extend substantially parallel to the columns of device areas between a pair of associated adjacent columns of device areas, wherein each device area has two adjacent support rails with a first of the adjacent support rails extending along the first side of the device area and carrying all of the leads associated with the device area and the second of the adjacent support rails extending along the second side of the device area and carrying the die attach pad associated with the device area, wherein two of the support rails in the two dimensional array are edge support rails that carry components for only a single adjacent column and at least one additional support rail is a middle support rail that carries components for two adjacent columns, whereby all of the leads and die attach pads associated with the device areas in the two dimensional array are carried by the support rails; and wherein the device areas within the two dimensional array can be singulated by single pass gang cutting along row and column lines with a single cut being made between adjacent device areas, with the cuts between adjacent columns being made along the support rails.

\* \* \* \* \*